United States Patent [19]

Gu

[11] Patent Number: 5,827,370
[45] Date of Patent: Oct. 27, 1998

[54] METHOD AND APPARATUS FOR REDUCING BUILD-UP OF MATERIAL ON INNER SURFACE OF TUBE DOWNSTREAM FROM A REACTION FURNACE

[75] Inventor: Youfan Gu, Boulder, Colo.

[73] Assignee: MKS Instruments, Inc., Andover, Mass.

[21] Appl. No.: 782,785

[22] Filed: Jan. 13, 1997

[51] Int. Cl.[6] ............................. C23C 16/00; F16L 55/00; F16L 9/18
[52] U.S. Cl. .......................... 118/715; 138/104; 138/114; 427/248.1
[58] Field of Search ............................. 118/715; 137/240; 138/104, 114; 427/248.1

[56] References Cited

U.S. PATENT DOCUMENTS

| | | | |
|---|---|---|---|
| 4,911,102 | 3/1990 | Manabe et al. | 118/719 |
| 5,160,543 | 11/1992 | Ishihara et al. | 118/715 |
| 5,722,802 | 3/1998 | March | 406/46 |

FOREIGN PATENT DOCUMENTS

| | | | |
|---|---|---|---|
| 1-286306 | 11/1989 | Japan | 118/715 |

OTHER PUBLICATIONS

Brodsky et al, Method of Preparing Hydrogenated Amorphous Silicon, IBM Technical Disclosure Bulletin vol. 22. No. 8A pp. 3391–3392, Jan. 1980.

Dusinberre, Gas Turbine Power, p. 158, 1952.

Giampaolo, The Gas Turbine handbook: Principles and Practices, pp. 35–39, 1997.

Primary Examiner—R. Bruce Breneman
Assistant Examiner—Jeffrie R. Lund
Attorney, Agent, or Firm—Scott B. Allison; James R. Young; Chrisman, Bynum & Johnson, P.C.

[57] ABSTRACT

An apparatus for preventing the deposition and build-up of chains of polymerized TEOS molecules in the pipes downstream from a reaction furnace in a semiconductor manufacturing process includes an annular nozzle assembly positioned inside the pipes such that a plenum is formed between the annular nozzle assembly and the pipes and such that the annular nozzle forms a hollow tubular conduit for conducting effluent from the reaction furnace. The annular nozzle assembly preferably includes three hollow and generally cylindrical sections, an upstream collar, a downstream spacer ring, and a middle section(s) positioned between the upstream collar and the downstream spacer ring. The annular nozzle assembly is placed within the pipes downstream of the reaction furnace during operation and is modularly constructed so that the length of the annular nozzle assembly can be varied, depending on the length of the downstream pipes from the reaction furnace. The annular nozzle assembly forms a gas boundary layer or moving virtual wall on its inner surfaces that prevents TEOS gas molecules and water vapor molecules from absorbing or residing on the inner surfaces of the annular nozzle assembly, thus preventing surface chemical reactions between TEOS gas molecules and water vapor molecules on the inner surfaces of the annular nozzle assembly, thereby preventing the deposition and build-up of chains of polymerized TEOS molecules on the inner surfaces of the annular nozzle assembly or the inner surfaces of the pipes in which the annular nozzle assembly is placed.

76 Claims, 6 Drawing Sheets

METHOD AND APPARATUS FOR REDUCING BUILD-UP OF MATERIAL ON INNER SURFACE OF TUBE DOWNSTREAM FROM A REACTION FURNACE

BACKGROUND OF THE INVENTION

1. Field of the Invention

This invention relates generally to a method and apparatus for reducing the deposition and build up of materials in a tube and, more specifically, to a method and apparatus to create a gas boundary layer on the inner surface of a tube connected to an outlet of a reaction chamber, such as a chemical vapor deposition (CVD) chamber or an etching chamber, mainly to inhibit surface chemical reactions of gases exiting the reaction chamber that cause depositions on inside surfaces of the tube.

2. Description of the Prior Art

Recently, the use of tetraethylorthosilicate or tetraethoxysilane gas ($Si(OC_2H_5)_4$), otherwise known as TEOS gas, has been used increasingly as a source material for the chemical vapor deposition (CVD) of silicon dioxide film onto silicon wafers in a reaction furnace for the manufacture of semiconductor devices, because silane, which has usually been used in the past, is pyrophoric, thus easily ignitable and not very safe, and diluted silane, which is somewhat safer, results in inferior step coverage and poor gap filling on the wafers. Using TEOS gas as a source material for the silicon dioxide results in excellent step coverage, high film quality, and low particulate contamination during the semiconductor manufacturing process. Therefore, the use of TEOS gas is promising in the development of very large scale integration (VLSI) devices in low pressure chemical vapor deposition (LPCVD) processes. In addition, TEOS can also be used in plasma enhanced chemical vapor deposition processes (PECVD), sub-atmospheric chemical vapor deposition processes (SACVD), and pyrolysis processes. However, the use of TEOS gas as a source material for silicon dioxide does create some other significant problems. For example, water vapor ($H_2O$), which is created in chemical vapor deposition (CVD) processes using TEOS gas in semiconductor manufacturing processes and discharged in the effluent from the reaction chamber hydrolizes and polymerizes unreacted or undecomposed TEOS gas that is also in the effluent, thereby forming chains of polymerized TEOS molecules on the inside surfaces of pipes in the pump line and other equipment downstream of the reaction process chamber or furnace. The chains of polymerized TEOS molecules will continue to grow and will eventually form a solid material when they become sufficiently large. The solid chains of polymerized TEOS molecules will deposit and cause solid build-up on surfaces, such as on the inside surfaces of the pipes or pump line segments used to convey the effluent gas away from the reaction chambers, in vacuum pumps, and in other equipment. Such solid buildup in pipes, pumps, and other equipment downstream from the reaction process chamber can partially or even entirely plug the pipes, damage the pumps and other equipment, reduce vacuum conductance, and render piping, pumps, and other equipment used in the manufacturing process functionally impaired or inoperative. Solid buildup in the pipe segments downstream of the reaction furnace can also flake apart and fall off the piping surfaces and migrate back into the reaction process chamber to become a source of contamination in the manufacturing process that ruins or substantially degrades the substrate wafers of semiconductor chips being manufactured in the process. When such contamination and buildup occurs, the manufacturing system must be shut down, while the solid polymerized TEOS material is cleaned out of the system, and the clogged pipes and pumps have to be cleaned or replaced. Such stoppages and ruined or degraded substrate wafers or semiconductor chips can and do cause substantial costs as well as loss of expensive material and production losses in semiconductor manufacturing.

It should also be noted that chains of polymerized TEOS molecules can be formed directly in the reaction chamber as a result of chemical reaction between TEOS gas molecules and water vapor molecules in the reaction furnace. However, due to the large volume of the reaction chamber relative to the surface area in the reaction chamber, which creates a relatively thick diffusion barrier layer relatively little of polymerized TEOS molecules will be adsorbed, thus deposited on the inside wall of the reaction chamber and most of the polymerized TEOS molecules in the reaction chamber will remain in the gas or vapor phase and will be pumped out of the reaction chamber into the pipe segments downstream of the reaction chamber. Unfortunately, only a few more chemical reaction steps are needed to turn the gaseous chains of polymerized TEOS molecules formed in the reaction chamber into solid chains of polymerized TEOS molecules that deposit and build on the inside surfaces of the pipes or tubing downstream of the reaction chamber, particularly when the rate of adsorption for these polymerized TEOS molecules on the wall is quite high.

In order to prevent the solid chains of polymerized TEOS molecules from clogging or contaminating the manufacturing system, the polymerized TEOS molecules must be kept from solidifying or it has to removed from the piping system being used in the manufacturing process. In a typical LPCVD semiconductor manufacturing process, a vacuum pump is connected by piping to the outlet of the chemical reaction or deposition chamber to pull the chamber pressure down to the desired reaction pressure. The reaction gases are introduced through an inlet into the reaction chamber where they chemically react in the vacuum to produce the desired material, such as silicon dioxide, that deposits on semiconductor substrates in the chamber. The reaction by-products, including the water vapor, as well as unreacted or undecomposed TEOS gas, are drawn by the vacuum pump out of the chamber. However, preventing solidification of the chains of polymerized TEOS molecules in piping leading away from the reaction chamber outlet and preventing buildup of the byproduct materials in the vacuum pump and other piping components has been an elusive goal prior to this invention.

One common method of trying to prevent the chemical reaction between the TEOS gas and the water vapor has been to dilute TEOS gas and water vapor with another gas, such as nitrogen. When the nitrogen gas injected along with source material gases into the reaction chamber, the nitrogen gas becomes a dilute gas of the semiconductor manufacturing process and is discharged from the reaction chamber along with the effluent water vapor and the unreacted on partially polymerized TEOS gas to dilute the unreacted polymerized TEOS gas and water vapor in the effluent and thereby inhibit the chemical reaction between the water vapor and TEOS gas that results in the polymerized TEOS molecules that solidify and build on the downstream pipe and pump surfaces. The nitrogen also reduces the concentrations (or partial gas pressures) of the TEOS gas and the water vapor such that the rate of the chemical reaction between the TEOS gas and the water vapor is reduced in the reaction chamber. However, the dilution of the source material gases injected into the reaction chamber with nitrogen or other dilution gases also reduces the speed of deposition of silicon dioxide on the silicon wafer and, therefore, reduces the yield and efficiency of the semiconductor manufacturing process. As an alternative, the nitrogen or other dilution gas can also be injected into the tubes or pipes connected downstream of the reaction furnace to dilute the water vapor and the unreacted or partially polymerized TEOS gas molecules downstream of the reaction chamber without raising the pressure or otherwise interfering with silicon dioxide formation and deposition within the reaction furnace. Unfortunately, such dilution with nitrogen does not really reduce very significantly the amount of solid chains of polymerized TEOS material that deposits and builds on the inner surfaces of the tubes or pipes downstream of the reaction furnace, so such nitrogen dilution methods have not been particularly effective or beneficial.

Consequently, in spite of the well-developed state of semiconductor manufacturing technology, there has still been a need for a method and apparatus for reducing the deposition and build-up of solid chains of polymerized TEOS gas molecules in piping lines and pumps downstream of reaction furnaces in semiconductor manufacturing processes where TEOS gas is used as the source material for silicon dioxide being deposited on wafers in reaction furnaces. Ideally, such a method and apparatus would not reduce the efficiency and yield of the semiconductor manufacturing process and, but would instead increase the efficiency and yield of the semiconductor manufacturing process.

SUMMARY OF THE INVENTION

Accordingly, it is a general object of this invention to provide a method and apparatus for reducing deposition and build-up of polymerized TEOS molecules formed downstream of a reaction furnace in a semiconductor manufacturing process.

It is a more specific object of this invention to provide a method and apparatus for reducing rates of reactions between TEOS gas and water vapor downstream of a reaction furnace in a semiconductor manufacturing process.

It is another more specific object of this invention to provide an apparatus for reducing formation of polymerized TEOS molecules formed downstream of a reaction furnace in a semiconductor manufacturing process wherein no significant modifications to the reaction furnace or the pipe line downstream of the reaction furnace are necessary.

It is another general object of this invention to reduce the adsorption or surface retention of TEOS molecules and nitrogen molecules on the inner surfaces of pipes downstream from a reaction furnace.

It is a further general object of this invention to reduce amounts of solid polymerized TEOS material that flow upstream into a reaction furnace.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described herein, the apparatus of the present invention includes tubular member or structure having a generally hollow shape with two open ends, a generally cylindrically shaped wall with openings or slots in the generally cylindrical shaped wall through which a gas or fluid can flow without passing through either of the open ends, and deflectors or redirectors which create a boundary layer or wall of gas or fluid flowing along the inner surface of the apparatus when gas or fluid is pumped through the slots or openings in the generally cylindrical wall.

To achieve the foregoing and other objects and in accordance with the purposes of the present invention, as embodied and broadly described herein, the method of the present invention includes the steps of creating and maintaining a laminar layer or virtual wall of inert or reactive gas along the inner surface of a tube or tubes through which water vapor molecules and unreacted or undecomposed TEOS gas molecules discharged from a reaction furnace are flowing and maintaining the gas pressure within the tube or tubes high enough to keep the inert or reactive gas molecules flowing between the inner surfaces of the tube or tubes and the water vapor molecules and unreacted or undecomposed TEOS gas molecules and to keep the water vapor molecules and the unreacted or undecomposed TEOS gas molecules from contacting or residing on the inner surfaces of the tube or tubes.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention. In the Drawings.

DETAILED DESCRIPTION OF THE PREFERRED EMBODIMENTS

Figure 1:
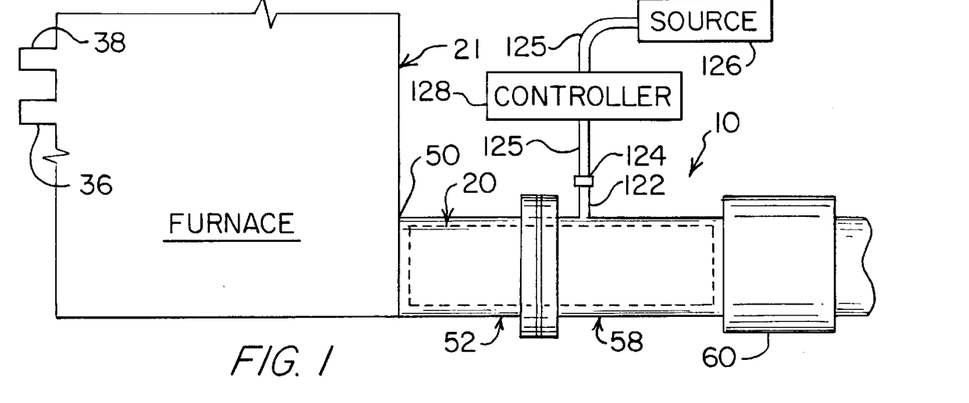
FIG. 1 is a diagrammatic view of a semiconductor manufacturing system showing a reaction furnace, an exit pump line segment, a pump line extension segment, the gas boundary layer apparatus of FIG. 1 inserted into the exit pump line segment and the pump line extension segment, and a source for the gas being used with the gas boundary layer apparatus.
Figure 2:
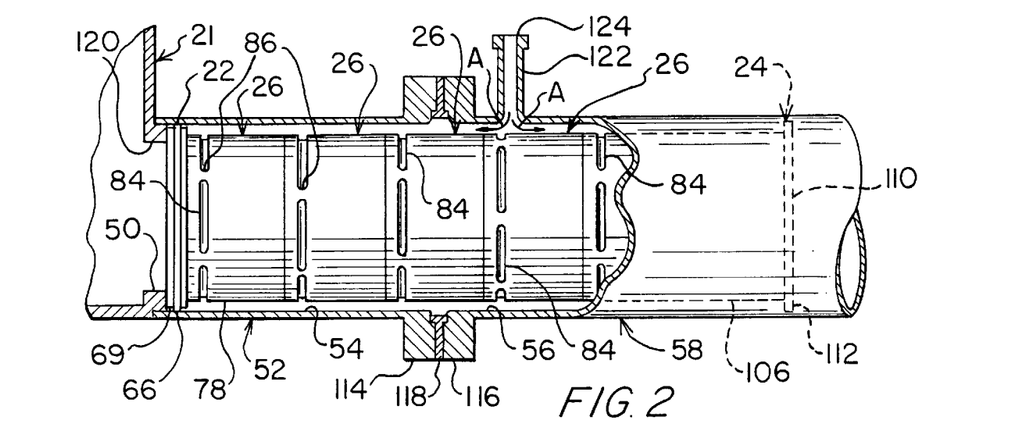
FIG. 2 is a cutaway elevation view of a portion of the reaction furnace, the exit pump line segment, the pump line extension segment, and the gas boundary layer apparatus of FIG. 1, showing the gas boundary layer apparatus of FIG. 1 in more detail, and showing nonalignment of the slots on the middle section in relation to the slots on the downstream spacer ring.

Gas boundary layer creating apparatus 10 according to the present invention for use in inhibiting the deposition and buildup of chains of polymerized TEOS molecules, particularly solid chains of polymerized TEOS molecules, in pump line segments located downstream from or after a reaction furnace or chamber 21 during a semiconductor manufacturing process is illustrated in FIGS. 1 and 2. The apparatus 10 includes an elongated annular nozzle assembly 20 positioned inside pipe line segments 52, 58 such that a hollow annulus, plenum, or volume is created between the inner surfaces 54, 56 of the respective pipe segments 52, 58 and the outer surfaces of the annular nozzle assembly 20. When the annular nozzle assembly 20 is positioned within the pipe line segments 52, 58, TEOS gas molecules, water vapor molecules, and other effluent flow from the reaction chamber 21 through the annular nozzle assembly 20 and the pipe line segments 52, 58, and are thereby conducted through the annular nozzle assembly 20. The annular nozzle assembly 20 minimizes the amount of deposition and build-up of chains of polymerized TEOS molecules, which are formed as a result of chemical reaction between TEOS gas molecules and water vapor molecules as the TEOS gas molecules and water vapor molecules flow through the annular nozzle assembly 20, on the inner surfaces 54, 56 of the respective pipe line segments 52, 58 and on the inner surfaces 72, 85, 94, 96, 108 of the annular nozzle assembly 20. The pipe line segments 52, 58 are preferably located immediately downstream of the reaction furnace 21 and positioned such that gases discharged from the reaction chamber 21 flow through the hollow interior conduit or duct formed by the annular nozzle assembly 20 but not through the annular volume or plenum formed between the pipe line segments 52, 58 and the annular nozzle assembly 20.

Figure 3:
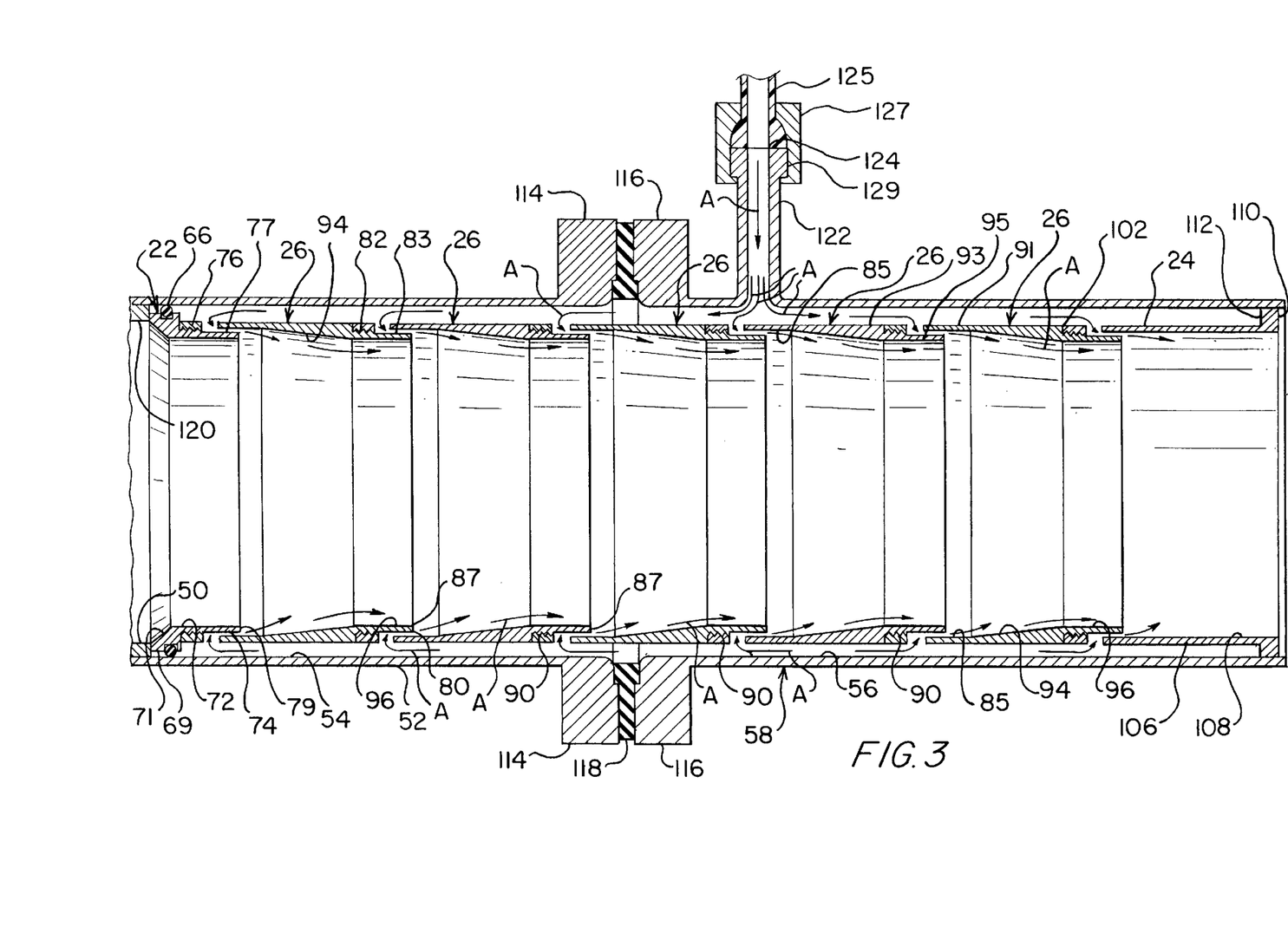
FIG. 3 is cross-sectional view of the inside of the pump line segments and the gas boundary layer device of FIG. 1 showing all of the slots on the middle section and the slots on the downstream spacer ring generally aligned with each other.

The annular nozzle assembly 20 causes a fluid or gas, such as, for example, nitrogen or other inert gas, injected or otherwise introduced into the pipe segments 52, 58 to flow in a laminar layer, boundary, or moving virtual wall of gas along the inner surface of the interior conduit formed by the annular nozzle assembly 20 in a direction generally downstream and away from the reaction furnace 21, as illustrated by the flow arrows A in FIGS. 2 and 3. This moving layer, wall, or boundary of gas covering and flowing along the inner surfaces 85, 94, 96, 108 of the annular nozzle assembly 20 reduces, and can even prevent, adsorption or surface retention of TEOS gas molecules and water vapor molecules on the inner surfaces 85, 94, 96, 108 of the annular nozzle assembly 20 and the inner surfaces 54, 56 of the respective pipe line segments 52, 58, which will reduce or prevent surface chemical reaction between the TEOS gas molecules and water vapor molecules adsorbed on the inner surfaces 85, 94, 96, 108 of the annular nozzle assembly 20 and the inner surfaces 54, 56 of the respective pipe line segments 52, 58, thereby reducing the deposition and build-up of solid chains of polymerized TEOS molecules on the inner surfaces 85, 94, 96, 108 of the annular nozzle assembly 20 and the inner surfaces 54, 56 of the respective pipe segments 52, 58, as will be discussed in more detail below. The gas forming the boundary or virtual wall on the inner surface of the annular nozzle assembly 20 is preferably an inert gas, such as nitrogen, but can also be a reactive gas.

A representative elevation view of a portion of a semiconductor manufacturing process is shown in FIGS. 1–3. In a typical semiconductor manufacturing example, it is often desirable to deposit silicon dioxide ($SiO_2$) on silicon wafers as a dielectric film or a resist for an etching process, as is well known in the semiconductor manufacturing industry. To do so, the wafer(s) to be coated with silicon dioxide is positioned in a reaction chamber or furnace 21, and reaction or source material gases, such as tetraethylorthosilicate or tetraethoxysilane gas ($Si(OC_2H_5)_4$), otherwise known as TEOS gas, are fed, pumped, or otherwise introduced into the reaction furnace 21 through the inlet 36 or the inlet 38. Upon heating of the TEOS gas to approximately 750° C. within the reaction chamber 21, the TEOS gas decomposes and forms silicon dioxide within the reaction furnace 21 according to the following chemical reaction which illustrates the pyrolysis or decomposition of the TEOS gas:

$$Si(OC_2H_5)_4 \rightarrow SiO_2 + 4C_2H_4 + 2H_2O \tag{1}$$

Since each TOES gas molecule already contains silicon as well as oxygen, TEOS gas molecules do not require additional oxygen molecules to yield a silicon dioxide molecule when sufficient heat is provided in the reaction furnace 21 to cause chemical decomposition of the TEOS gas molecule. As an alternative to the pyrolysis or decomposition of TEOS gas shown in equation (1) to form the silicon dioxide, both TEOS gas and oxygen can be injected into the reaction chamber 21 through the inlets 36, 38. When the reaction chamber or furnace 21 is heated to approximately 700° C., the TEOS gas and oxygen react according to the following equation to form silicon dioxide in the reaction furnace 21:

$$Si(OC_2H_5)_4 + 8O_2 \rightarrow SiO_2 + 8CO + 10H_2O \tag{2}$$

As an alternative to the reaction provided in equation (2), when the reaction furnace 21 is heated to approximately 400° C., the TEOS gas and the ozone injected into the reaction furnace 21 through the inlets 36, 38 and will chemically react in the reaction furnace 21 according the following equation to form silicon dioxide in the reaction furnace 21:

$$Si(OC_2H_5)_4 + 8O_3 \rightarrow SiO_2 + 8CO_2 + 10H_2O \tag{3}$$

Other reaction processes in the reaction furnace 21 using TEOS gas are also possible to form the silicon dioxide from the TEOS gas injected into the reaction chamber 21.

Figure 4:
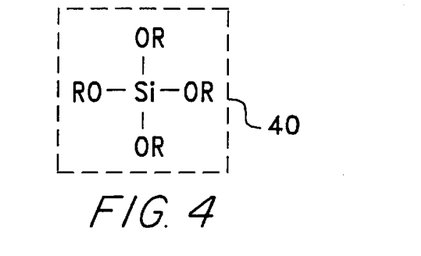
FIG. 4 is a representation of a TEOS molecule that flows through the apparatus of FIG. 1, wherein R represents an ethyl alcohol radical $C_2H_5$.
Figure 5:
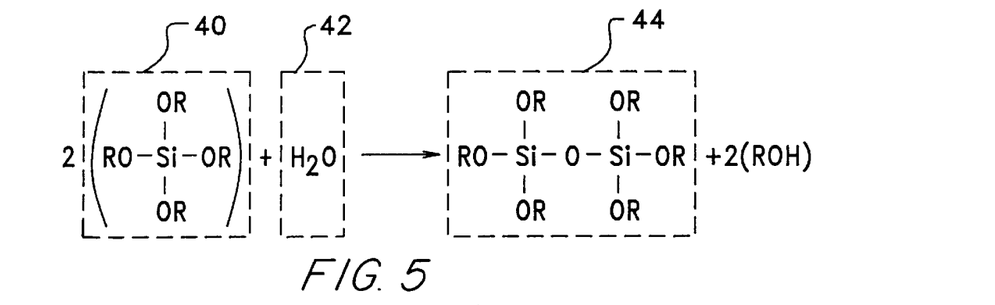
FIG. 5 is a representation of the formation of a polymerized TEOS molecule when the TEOS of FIG. 4 reacts with water vapor.
Figure 6:
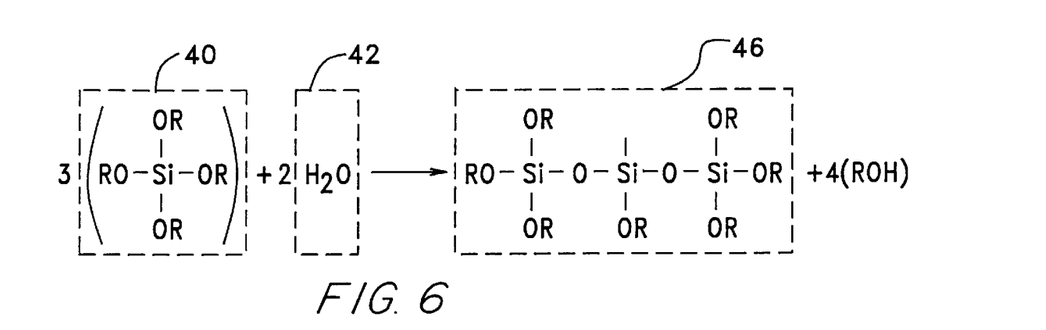
FIG. 6 is a representation of the formation of a polymerized TEOS molecule that is larger than the polymerized TEOS molecule of FIG. 5 formed by the reaction of TEOS with water vapor.
Figure 7:
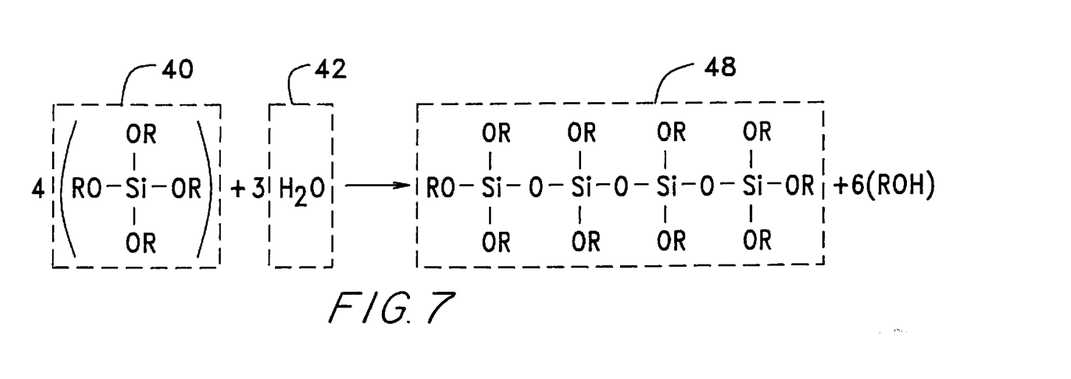
FIG. 7 is a representation of the formation of a polymerized TEOS molecule that is larger than the polymerized TEOS molecule of FIG. 6 formed by the reaction of TEOS with water vapor.

As shown in equations (1)–(3) above, water vapor ($H_2O$) is a byproduct of each of the chemical reactions used to create the silicon dioxide ($SiO_2$) from the TEOS gas. Unfortunately, TEOS gas is very unstable in the presence of water vapor. That is, the molecules of the TEOS gas are easily hydrolyzed in the presence of water vapor which causes the TEOS gas molecules to undergo chemical alteration to form chains of polymerized TEOS molecules. More specifically, the molecular formula for TEOS gas is $Si(OC_2H_5)_4$ and each TEOS gas molecule comprises essentially four organic groups (ethanol radicals) attached to a silicon (Si) atom through only oxygen (O) atoms. Structurally, a TEOS gas molecule 40 can be expressed as illustrated in FIG. 4 where R represents an ethyl alcohol (ethanol) radical given by the molecular formula $C_2H_5$. When the TEOS gas molecules 40 react with the water vapor molecule or molecules 42, the TEOS gas molecules 40 become hydrolyzed and polymerized to form a polymerized TEOS molecule 44, as illustrated in FIG. 5. A polymer is a large molecule made from many units or other molecules linked together chemically so that the polymerized molecule comprises a giant molecule formed by the union of simple molecules. So long as enough water molecules ($H_2O$) 42 exist, the polymerization process of the TEOS molecules 40 will continue and large chains 46, 48 of polymerized TEOS molecules TEOS will be formed, as illustrated in FIGS. 6 and 7, respectively. Eventually, when the chains 48 of polymerized TEOS molecules becomes sufficiently large, the chains 48 of polymerized TEOS molecules will assume solid form.

Referring again to FIGS. 1–3, not all of the TEOS gas injected into the reaction furnace 21 will react within the reaction furnace 21 to form silicon dioxide. Therefore, some of the TEOS gas injected into the reaction furnace 21 will exit the reaction furnace 21 through the furnace outlet 50 and flow into the first pump line segment or pipe segment 52. The pump or pipe segment 52 may actually be an integral part of the reaction furnace 21. In addition, most, if not all, of the water vapor ($H_2O$) created as a byproduct gas during the chemical reaction process in the reaction furnace 21 will also exit the reaction furnace 21 through the furnace outlet 50 and flow into the first pump line segment or pipe segment 52. Without the boundary layer creating apparatus 10 of the present invention, when the chains 48 of polymerized TEOS molecules solidify, they will deposit on the inner or inside surfaces 54, 56 of the respective pipe segments 52, 58 and the inner or inside inner surfaces of whatever pipe line segments, pumps, and equipment located downstream of the reaction furnace 21, thereby clogging the pipe segments 52, 58 and other pipes and equipment located downstream of the reaction furnace 21. In addition, some of the solid material created in the pipes downstream from the reaction furnace 21 can flow upstream and into the reaction furnace 21 through the furnace outlet 50 and deposit on a wafer in the reaction furnace 21, thereby damaging the wafer and reducing the yield and efficiency of the semiconductor manufacturing process. It should be noted that, while the pipe line segments 52, 58 are illustrated and discussed as separately identifiable and separable pipe segments, the annular nozzle assembly 20 can be placed inside a single pipe line segment and the number of pipe line segments into which the annular nozzle assembly 20 is placed does not significantly change the operation or structure of the annular nozzle assembly 20 or the concepts underlying the annular nozzle assembly 20 of the present invention.

An important concept underlying the present invention is the recognition that reaction of the TEOS gas molecules and the water vapor molecules in a pipe or pump line segment occurs primarily on surfaces, although some gas phase reaction between the TEOS gas molecules and the water vapor molecules does occur, and the apparatus 10 and method of this invention inhibits such surface reaction. The creation of the chains of polymerized TEOS molecules does not occur merely by a change in phase as a result in a change in temperature of the TEOS gas exiting the reaction furnace. Therefore, build-up of solid material on the inner surface of pump lines or pipes downstream of the reaction furnace is not a result of sublimation or condensation of the TEOS gas. Instead, chains of polymerized TEOS gas molecules are created by the chemical reaction of the TEOS gas molecules and the water vapor molecules. The majority of the chemical reaction between the TEOS gas molecules and the water vapor molecules will occur on a surface such as the inner surface of a pipe or pump line segment rather than in a flowing gas stream because of physical adsorption of the TEOS gas on surfaces of the pipe or pump line segments. Polymerization is usually a relatively slow chemical reaction process. The adsorption of the TEOS gas molecules and the water vapor molecules on the surfaces of pipe or pump line segments holds the molecules in close proximity to each other for sufficient time to create the opportunity for such slow surface chemical reaction between the TEOS gas molecules and the water vapor molecules to proceed. Therefore, the method of reducing build-up of polymerized chains 48 of TEOS molecules according to the present invention is to prevent the TEOS gas molecules 40 and the water vapor molecules 42 flowing through the hollow conduit formed by the annular nozzle assembly 20 from adsorbing or residing on, or even contacting, either the inner surfaces 54, 56 of the respective pipe segments 52, 58, which prevents the TEOS gas molecules 40 and the water vapor molecules 42 from chemically reacting and forming the polymerized chains of TEOS molecules that would otherwise result in the deposition and buildup of solid chains of polymerized TEOS molecules on the inner surfaces 54, 56 of the respective pipe segments 52, 58.

Another important concept underlying the apparatus and method of the present invention is that since a polymerization process is a chemical process, the rate of chemical reaction of the TEOS gas molecules and the water vapor molecules will increase with an increase in temperature inside the pipe segments 52, 58 and the annular nozzle assembly 20. Therefore, the higher the temperature of the inner surfaces of a pipe or pump line, the faster the chemical reaction rate between TEOS gas molecules and the water vapor molecules flowing through the pipe or pump line and, as a result, the greater the deposition and build up of solidified chains of polymerized TEOS molecules on the inner surfaces of the pipe or pump line segments. In addition, the lower the temperature of the inner surfaces of a pipe or pump line, the higher the rate of adsorption on the inner surfaces of the pipe or pump line and, as a result, the longer the resident time for TEOS and $H_2O$ molecules. As a result of the longer resident time, the deposition and build up of solidified chains of polymerized TEOS molecules on the inner surfaces of the pipe or pump line segments will increase. Therefore, there is an optimal temperature point at which the TEOS gas molecules and the water vapor molecules flowing through the pipe or pump line segment are maintained so as to minimize the rate of solid deposition on the inner wall of the pump line, as will be discussed in more detail below. For purposes of the present invention, the temperature of the pipe segments 52, 58 and their respective inner surfaces 54, 56 can be maintained at the desired level by installing a heater, heating jacket, or other warming device (not shown) around the pipe segments 52, 58. For example, a 135° C. HPS 45 Series heater manufactured and sold by HPS Division, MKS Instruments, of Boulder, Colo., could be used to heat the pipe segments 52, 58. The pipe segments 52, 58 act as an outer shell for the annular nozzle assembly 20. Heat generated by the heating device surrounding the pipe segments 52, 58 will be conducted or radiated so as to heat the annular nozzle assembly 20. In addition, the temperature of the inner surfaces 54, 56, the pipe segments 52, 58 and the annular nozzle assembly 20 can also be maintained at the desired level by controlling the temperature of the gas or fluid injected in the pipe segments 52, 58 and the annular nozzle assembly 20, as will be discussed in more detail below.

A significant feature of the annular nozzle assembly 20 of the present invention is that the annular nozzle assembly 20 inhibits TEOS gas flowing in the pipe line segments 52, 58 from contacting and being adsorbed on the inside surfaces 54, 56 of the respective pipe line segments 52, 58, thus reducing and possibly preventing the chemical reaction of the TEOS gas molecules 40 and the water vapor molecules 42 on the inner surfaces 54, 56 and thereby inhibiting the deposition and build-up of solidified chains of polymerized TEOS molecules within the pipe line segments 52, 58, as will be discussed in more detail below. Instead of forming chains of polymerized TEOS molecules within the pipe segments 52, 58, the unreacted or undecomposed TEOS gas molecules 40 and the water vapor molecules 42 exiting the reaction furnace 21 through the furnace outlet 50 will continue to flow downstream through the pipe line segments 52, 58 and can be collected at a more suitable place, such as a trap 60, positioned further downstream from the reaction furnace 21 than the pipe segments 52, 58.

The annular nozzle assembly 20 preferably has a generally hollow cylindrical or tubular shape and, as previously discussed above, preferably includes an upstream collar or section 22, a downstream spacer ring or section 24, and, in most cases, one or more modular middle sections 26 positioned between, and connected to, the upstream collar 22 and the downstream spacer ring 24. The upstream collar 22 is preferably positioned proximal to the reaction furnace 21 at the furnace outlet 50. The downstream ring 24 is preferably positioned distally from the reaction furnace 21.

The upstream collar 22 includes the o-ring or seal 66 which is seated in the notch or groove 68 in the rim 69, as illustrated in FIGS. 3, and 8–10. The o-ring or seal 66 forms a tight seal, preferably a gas tight seal, against the inner surface 54 of the pump line segment 52 (see FIGS. 2 and 3) when the annular nozzle assembly 20 is placed into the pump line segments 52, 58, as will be discussed in more detail below. The o-ring 66 can comprise a rubber, plastic, or other suitable material.

The rim 69 is on the upstream end of the upstream collar 22 and preferably includes a inclined or angled upstream surface 71 to reduce the impact between gases discharged from the reaction furnace 21 and the rim 69 and to reduce the build-up of material on the rim 69 of the upstream collar 22 as gas and other particulate matter flows from the reaction furnace 21 into the upstream collar 22 through the entrance port of the upstream collar 22 formed by the rim 69. In addition, the upstream collar 22 includes a generally smooth and cylindrical inner surface 72 and cylindrical outer or outside surface 74. A portion of the cylindrical outer surface 74 contains the external threads 76 for mating or otherwise attaching or coupling the upstream collar 22 to the middle section 26 or the downstream spacer ring 24, as will be discussed in more detail below. The unthreaded portion 77 of the surface 74 is generally smooth to enable the insertion of the downstream end 79 of the upstream collar 22 into the middle section 26 or the downstream spacer ring 24. With the exception of o-ring 66, the upstream collar 22 is preferably comprises a stainless steel material or other suitable metallic material. The diameter of the upstream collar 22 is generally related to the size of the pump line segment into which the apparatus is to be placed, as will be discussed in more detail below. In comparison with the longitudinal or axial length of the middle section 26 and the downstream spacer ring 24, the longitudinal or axial length of the upstream collar 22 is preferably minimized, as will also be discussed in more detail below.

The middle section 26 has a generally hollow cylindrical shape with a preferably smooth outer surface 78, as illustrated in FIGS. 2, 3, 8, 9, and 11. The middle section 26 also includes the outer surface 80 which has a diameter preferably identical to the diameter of the outer surface 74 on the upstream collar 22. A portion of the outer surface 80 includes the external threads 82 for mating or otherwise attaching the middle section 26 to the downstream spacer ring 24, as will be discussed in more detail below. The unthreaded portion 83 of the outer surface 80 is generally smooth to enable insertion of the downstream end 87 of the middle section 26 into the downstream spacer ring 24. Like the upstream collar 22, the middle section 26 preferably comprises a stainless steel material or other suitable metallic material.

Figure 11:
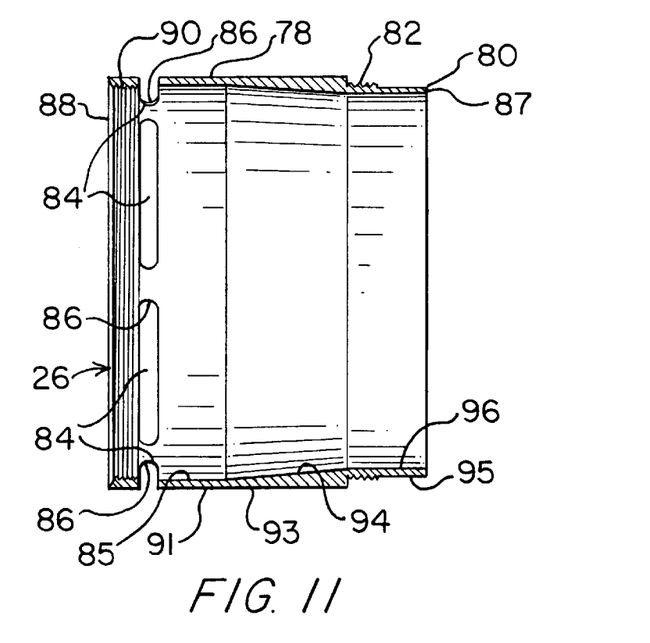
FIG. 11 is a cross-sectional view of the middle section of FIG. 9.

An important feature of the middle section 26 are the slots, ports, or openings 84 which extend from the outer surface 78 to the inner surface 85 of the middle section 26 and which are separated by the divider portions 86. The upstream end 88 of the inner surface 85 of the middle section 26 contains the internal threads 90 which mate with the external threads 76 on the upstream collar 22 when the upstream collar 22 is attached to the middle section 26, as will be discussed in more detail below. As best illustrated in FIGS. 3 and 11, the middle section 26 has a varying inner diameter and a varying wall thickness. The middle section 26 includes the cylindrically shaped wall 91 having the inner surface 85, the frustum shaped wall 93 having the inner surface 94, and the cylindrically shaped wall 95 having the inner surface 96, the purpose and operation of which will be discussed in more detail below.

Figure 12:
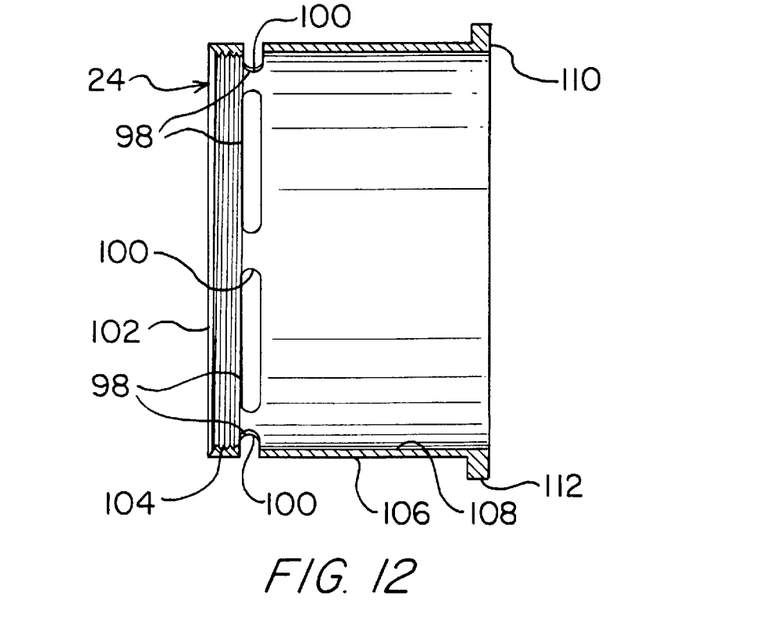
FIG. 12 is a cross-sectional view of the downstream spacer ring of FIG. 9.

The downstream spacer ring 24 is similar in many ways to the middle section 26. More specifically, the downstream spacer ring 24 includes slots or openings 98 separated by divider portions 100. The upstream end 102 of the middle section includes the internal threads 104 which are mateable or joinable with the external threads 82 on the middle section 26 or the external threads 76 on the upstream collar 22. The downstream spacer ring 24 has a generally cylindrical outer and smooth surface 106 and a generally cylindrical and smooth inner surface 108 (see FIGS. 3 and 12). The downstream end 110 of the downstream spacer ring 24 includes the radially extending rim 112 which has approximately the same outer diameter as the o-ring or seal 66 on the upstream collar 22. Like the upstream collar 22 and the middle section 26, the downstream spacer ring 24 preferably comprises a stainless steel material or other suitable metallic material.

As best illustrated by referring to FIGS. 1 and 3, when the upstream collar 22, the down stream section 24, and multiple middle sections 26 are coupled or attached together, the generally cylindrical and hollow tubular annular nozzle assembly 20 is created which creates a conduit through which TEOS gas molecules, water vapor molecules, and other effluent from the reaction chamber 21 can flow or be conducted. The tubular annular nozzle assembly 20 can have a circular, square, rectangular, oval, or other cross-sectional shape. If desired, the downstream spacer ring 26 can also be attached directly to the upstream collar 22. The middle sections 26 can be added or removed as needed to create a tube of the appropriate length. When an upstream collar 22 is joined or coupled to a middle section 26, the slots 84 in the middle section 26 are positioned over the unthreaded and generally smooth cylindrical portion 77 of the outer surface 74 of the upstream collar 22. Likewise, when a middle section 26 is joined or coupled to a downstream spacer ring 24, the slots 98 in the downstream spacer ring 24 are positioned over the unthreaded and generally smooth cylindrical portion 83 of the outer surface 80 of the middle section 26. Similarly, when two middle sections 26 are connected together, the slots 84 on one of the middle sections 26 are positioned over the unthreaded portion 83 of the surface 80 of the other middle section 26. The positioning of the slots 84, 98 over the smooth portions 77, 83, respectively, of the surfaces 74, 80, respectively, enable gas or fluids to flow from the exterior of the annular nozzle assembly 20 to the interior of the annular nozzle assembly 20 without passing through either the entrance port of the annular nozzle assembly 20 formed by the rim 69 of the upstream collar 22 or the exit port of the annular nozzle assembly 20 formed by the rim 112 of the downstream spacer ring 24, as will be discussed in more detail below. When an upstream collar 22, a downstream spacer ring 24, and a middle section 26 (or multiple middle sections 26) are connected together, it is not necessary that the slots 84, 98 are be oriented in parallel, as illustrated in FIG. 2 and as will also be discussed in more detail below.

Figure 8:
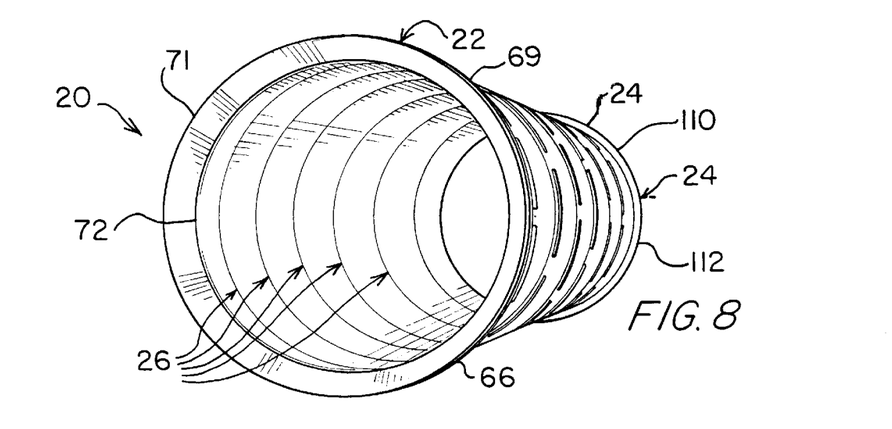
FIG. 8 is a perspective view of the gas boundary layer apparatus of FIG. 1 oriented so as to enable viewing into the upstream collar of the gas boundary layer apparatus of the present invention.
Figure 9:
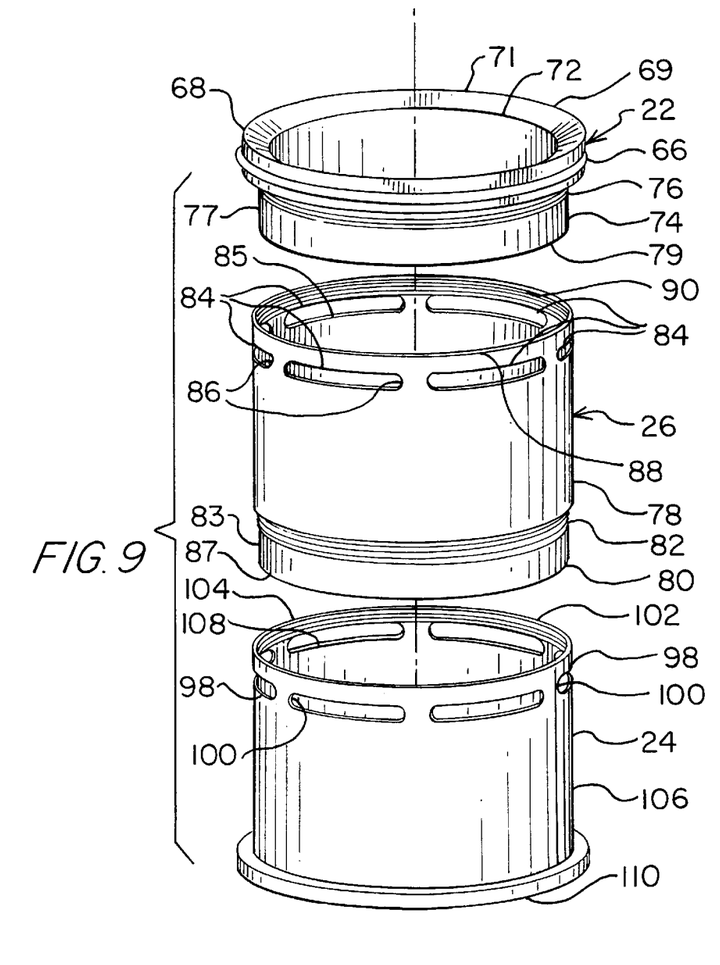
FIG. 9 is an exploded isometric view of the upstream collar, the downstream spacer ring, and one of the modular middle sections of the gas boundary layer apparatus of FIG. 1.
Figure 10:
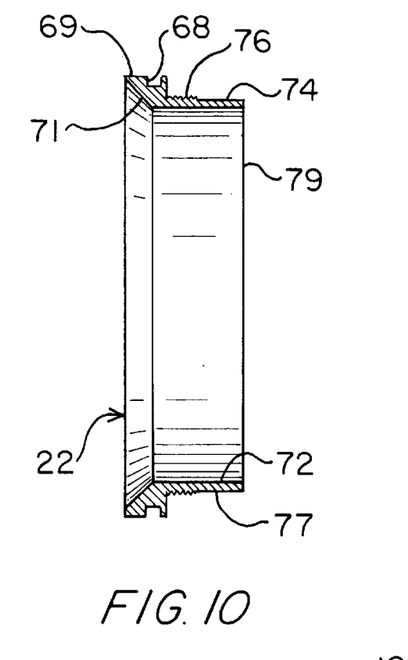
FIG. 10 is a cross-sectional view of the upstream collar of FIG. 9.
Figure 13:
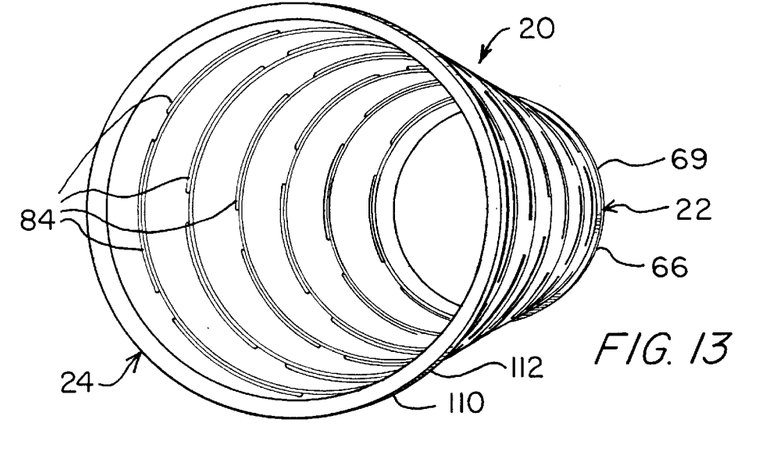
FIG. 13 is another perspective view of the gas boundary layer apparatus of the present invention similar to FIG. 8, but oriented so as to enable viewing into the downstream section of the gas boundary layer apparatus of the present invention.

When viewing the annular nozzle assembly 20 by looking into the entrance port of the annular nozzle assembly 20 formed by the rim 69 of the upstream collar 22, as best illustrated in FIGS. 3 and 8, the inner surface of the hollow tubular annular nozzle assembly 20 formed by the surface 72 of the upstream collar 22, the surfaces 85, 94, 96 of the middle section 26, and the surface 108 of the downstream spacer ring 24 appears generally smooth and regular. However, when viewing the annular nozzle assembly 20 by looking into the exit port of the annular nozzle assembly 20 formed by the rim 112 of the downstream spacer ring 24, as best illustrated in FIGS. 3 and 13, the inner surface of the hollow tubular apparatus formed by the surface 72 of the upstream collar 22, the surfaces 85, 94, 96 of the middle section 26, and the surface 108 of the downstream spacer ring 24 is revealed as being irregular so as to allow gas, vapor, or fluid external to the annular nozzle assembly 20 to flow into the hollow interior of the annular nozzle assembly 20 through the slots 84, 98.

During use of the annular nozzle assembly 20, the annular nozzle assembly 20 is preferably positioned within the hollow cylindrical volume formed by the pump line segments 52, 58 which are joined together at the flanges 114, 116. A flange separator, o-ring, or other seal 118 may be positioned between the flanges 114, 116 to ensure a tight, preferably hermetic, seal between the flanges 114, 116 and, as a result, the pump line segments 52, 58. The flanges 114, 116 are joined by conventional means such as bolts (not shown) passing through both flanges 114, 116, and the seal 118, or clamps (not shown) surrounding both of the flanges 114, 116. The pipe segments 52, 58 may also be welded together or, as previously described above, may constitute a single section or segment of pipe or pump line so that joining of separate pipe segments 52, 58 is not necessary. The method and devices for creating a tight, preferably airtight, connection of sections of pump or pipe lines in a semiconductor manufacturing process is well known to persons having ordinary skill in this art and need not be discussed in any further detail for purposes of the present invention.

When the annular nozzle assembly 20 is positioned within the pump line or pipe segments 52, 58, the rim 69 of the upstream collar 22 is preferably positioned adjacent the stop 120 on the reaction furnace 21, as illustrated in FIGS. 2 and 3. If the reaction furnace 21 does not have the stop 120, the annular nozzle assembly 20 is preferably positioned so that the rim 69 is positioned at the furnace outlet 50 of the reaction furnace 21. The o-ring or seal 66 preferably forms a tight, preferably air-tight, seal against the inner surface 54 of the pipe line segment 52 so that gas will not flow into the reaction furnace 21 from the volume created by the inner surface 54 of the pipe line segment 52 and the outside surfaces 78, 106 of the middle section 26 and the downstream spacer ring 24, respectively, and so that gas flowing out of the reaction furnace 21 through the furnace exit port 50 does not flow between the inner surface 54 of the pipe line segment 52 and the outside surfaces 78, 106 of the middle section 26 and the downstream spacer ring 24, respectively. The rim 112 of the downstream spacer ring 24 is positioned within the pipe line segment 58. Although, the rim 69 of the upstream collar 22 and the rim 112 of the downstream spacer ring 24 keep the annular nozzle assembly 20 generally aligned coaxially with the pipe line segments 52, 58, in fact, the rim 112 on the downstream spacer ring 24 is not required for the operation of the annular nozzle assembly 20 and the annular nozzle assembly 20 is not required to be positioned coaxially with the pipe line segments 52, 58. The rim 112 on the downstream spacer ring 24 improves the ease of installation of the annular nozzle assembly 20 but is not required by the annular nozzle assembly 20. All that is required is that some volume of space exist between the inner surfaces 54, 56 of the respective pipe segments 52, 58, and the outer surface of the annular nozzle assembly 20 created by the outer surfaces 78, 106 of the middle section 26 and the downstream spacer ring 24, respectively, so that gas or fluid injected into the pipe segments 52, 58 can flow through the slots 84, 98 in the middle section 26 and the downstream spacer ring 24, respectively, as will be discussed in more detail below.

Either the pipe line segment 52 or the pipe line segment 58 should contain an gas inlet or port 122 that allows gases or fluids to be injected into the volume, reservoir, or plenum formed between the inner surfaces 54, 56 of the respective pipe segments 52, 58 and the outer surface of the annular nozzle assembly 20. Typically, the port 124 on the inlet 122 is connected via a hose or tube 125 to a source 126 of the gas or fluid to be injected into the pipe line segments 52, 58. A controller 128, such as a mass flow controller or volume flow rate controller, may also be positioned between the source 126 and the port 124 on the inlet 126 to feed, pump, or otherwise introduce the gas or fluid from the source 126 to the port 122 and to control, monitor, or regulate the amount of gas or fluid injected into the interior of the pipe line segments 52, 58. The hose 125 connected to the pipe segment 58 at the port 124 may be securely fastened to the port 124 with a clamp 127 which may include internal threads (not shown) to mate with external threads (not shown) on the stem 129 of the port 124. In fact, the hose 125 can be permanently attached to the clamp 129 before the clamp 129 is placed over the stem 129. If desired, a second clamp (non-shown) capable of being tightened and untighted can be positioned around the clamp 129 and the stem 129 to ensure that the hose 125 and the clamp 129 maintain their desired position. The connection of a hose to a port on a pipe segment is well known to people having ordinary skill in the art and need not be discussed further for purposes of the present invention since there are many ways in which a fluid or gas from the source 126 can flow through a hose into the port 124 and, as a result, the plenum formed between the pipe segments 52, 58 and the annular nozzle assembly 20.

The outer diameter of the annular nozzle assembly 20 formed by the surfaces 78, 106 of the middle section 26 and downstream spacer ring 24, respectively, is preferably in a range between 2.50 and 2.75 inch for a three inch inner diameter pipe segment 52 and is preferably in a range between 3.25 inch and 3.50 inch for a four inch inner diameter pipe segment 52 to enable a sufficient volume or plenum to be formed between the inner surfaces 54, 56 of the pipe segments 52, 58, respectively, and the outer surface of the annular nozzle assembly 20 formed by the outer surfaces 78, 106 of the middle section 26 and downstream spacer ring 24, respectively, so as to enable the gas injected into the pipe segment 58 through the inlet 122 to flow through the slots 84, 98.

As previously discussed above, the modularity of annular nozzle assembly 20 allows the downstream spacer ring 24 to be attached directly to the upstream collar 22 and allows, if desired, multiple middle sections 26 to be connected between the upstream collar 22 and the downstream spacer ring 24. Therefore, the length of the annular nozzle assembly 20 is variable and depends, in large part, on the length of the pipe segments 52, 58. If a trap 60 is located after the downstream end of the pipe line segment 58 to collect the polymerized chains of TEOS molecules, the annular nozzle assembly 20 need only extend from the reaction furnace 21 to the entrance to the trap 60.

As previously discussed above, during a semiconductor manufacturing process where TEOS gas is injected into the reaction furnace 21, water vapor 42 and unreacted, undecomposed, or polymerized (but not yet solidified) TEOS gas molecules 40 are pumped out of the reaction chamber 21 through the furnace outlet 50 and into the pipe line segment 52. The annular nozzle assembly 20 is used to reduce and even prevent the adsorption of the TEOS gas molecules 40 and the water vapor molecules 42 on the inner surfaces 54, 56, of the pipe segments 52, 58, respectively, which will reduce and possibly prevent the surface chemical reaction between the TEOS gas molecules 40 and the water vapor 42 on the inside surfaces 54, 56 of the pipe line segments 52, 58, respectively, and, as a result, reduce and possibly prevent the deposition, build up, and growth of solid chains of polymerized TEOS molecules on the inside surfaces 54, 56 of the pipe line segments 52, 58, respectively, and reduce the amount of solid particulates of polymerized TEOS molecules that flow back into the reaction chamber or furnace 21 through the furnace outlet 50 which may contaminate and damage wafers in the reaction furnace 21, as will now be discussed in more detail.

Referring again to FIGS. 2 and 3, in the preferred operation of the annular nozzle assembly 20 during a semiconductor manufacturing process, nitrogen gas or other inert gas is fed or pumped from the source 126 and injected or otherwise introduced into the interior of the pipe line segment 58 via the hose or tube 125 and the gas inlet 122. The gas flows so as to substantially or completely fill the volume formed between the inner surfaces 54, 56 of the pipe line segments 52, 58, respectively, and the outer surface of the annular nozzle assembly 20, as indicated by the arrows A in FIGS. 2 and 3. Furthermore, the o-ring or seal 66 on the upstream collar 22 prevents the gas from flowing upstream into the reaction furnace 21 and the o-ring or seal 66 and the rim 112 of the downstream spacer ring prevent substantially all of the gas from flowing anywhere except through the slots 84 on the middle sections 26 and the slots 98 on the downstream spacer ring 24.

As best illustrated in FIG. 3, the gas from the source 126 that is injected into the interior of the pipe line segments 52, 58 through the inlet 122 flows through the slots 84 on the middle sections 26 and the slots 98 on the downstream spacer ring 24 toward the interior volume of the annular nozzle assembly 20. However, since each of the slots 84 on the middle sections 26 and each of the slots 98 on the downstream spacer ring 24 is positioned adjacent either the smooth portion 77 of the surface 74 of the upstream collar 22 or the smooth section 83 of the surface 80 of another middle section 26, gaps are formed between the inner surface 85 of the middle section 24 and the smooth surface portion 77 of the upstream collar 22, between the inner surface 85 of one middle section 26 and the smooth surface portion 83 of another middle section 26, and between the inner surface 108 of the downstream spacer ring 26 and the smooth surface portion 83 of the middle section 26. The gaps are preferably and approximately about one-eighth inch in height. The gas injected or otherwise flowing into the pipe segment 58 through the inlet 122 will disperse so as to flow through substantially all, and perhaps all, of the slots or openings 84, 98 in the middle sections 26, downstream spacer ring 24, respectively, and through the gaps formed as described above toward the inner volume of the annular nozzle assembly 20. However, the gas flowing from the volume formed between the inner surfaces 54, 56 of the pipe line segments 52, 58, respectively, and the outer surface of the annular nozzle assembly 20 through the slots 84, 98 to the interior of the annular nozzle assembly 20 does not flow radially inward toward the longitudinal axis of the annular nozzle assembly 20. Rather, the flow of the gas is redirected or deflected by the smooth portions 77, 83 of the surfaces 74, 80, respectively, such that the gas covers or coats, and flows along, the inner surfaces 85, 94, 96 of the middle sections 26 and the inner surface 108 of the downstream spacer ring 24. More specifically, the gas forms a boundary layer or moving wall covering preferably all, but at least a substantial portion of, the inner surfaces 85, 94, 96, 108 of the annular nozzle assembly 20 and flowing in a generally axial and downstream (from the reaction furnace 21) direction on or along the inner surfaces 85, 94, 96, 108 of the annular nozzle assembly 20.

The flow of the gas covering the inner surfaces 85, 94, 96, 108 of the annular nozzle assembly 20 is preferably a laminar flow. As a result of such moving laminar flow, a gas boundary layer or virtual wall is formed between the TEOS molecules 40 and water vapor molecules 42 flowing though the interior volume of the annular nozzle assembly 20 and the inner surfaces 85, 94, 96, 108 of the annular nozzle assembly 20. The flowing boundary layer or virtual wall formed on or covering the inner surfaces 85, 94, 96, 108 of the annular nozzle assembly 20 prevents, or at least inhibits, the TEOS gas molecules 40 and the water vapor molecules 42 from adsorbing on, residing on, attaching to, or otherwise touching or contacting the inner surfaces 85, 94, 96, 108 of the annular nozzle assembly 20, thereby inhibiting or preventing the surface chemical reaction between the TEOS gas molecules 40 and the water vapor 42 on the inner surfaces 85, 94, 96, 108 of the annular nozzle assembly 20 and, as a result, inhibiting or preventing the deposition, build-up, and growth of solid chains of polymerized TEOS molecules on the inner surfaces 85, 94, 96, 108 of the annular nozzle assembly 20. In addition, solid chains of polymerized TEOS molecules are prevented from depositing and building up on the inner surfaces 54, 56 of the respective pipe line segments 52, 58.

As a more detailed explanation of the operation of the annular nozzle assembly 20 described above, during the semiconductor manufacturing process, TEOS gas molecules 40 and water vapor molecules 42 are discharged from the reaction furnace 21 through the furnace outlet 50 into the pipe segment 52. The annular nozzle assembly 20 is preferably positioned within the pipe segments 52, 58 such that the rim 69 of the upstream collar 22 is positioned against the stop or brace 120 of the reaction furnace 21 or, if the stop 120 does not exist, such that the rim 69 of the upstream collar 22 is positioned at the exit port 50 of the reaction furnace 21. Moreover, the annular nozzle assembly 20 is preferably positioned within the pipe segments 52, 58 such that all of the gases or effluent discharged from the reaction furnace 21 through the exit port 50 flow through the hollow interior volume of the annular nozzle assembly 20.

In accordance with the method and apparatus of this invention, in order to reduce the surface chemical reaction between the TEOS gas molecules 40 and the water vapor molecules 42 on the inner surfaces 85, 94, 96, 108 of the annular nozzle assembly 20, the amount of TEOS gas molecules 40 and the water vapor molecules 42 contacting, residing on, or being adsorbed on the inner surfaces 85, 94, 96, 108 of the annular nozzle assembly 20, must be reduced. The gas molecules injected or otherwise fed or introduced into the pipe segments 52, 58 through the gas inlet 122 disperse and flow through the slots 84, 98 so as to form a thin layer or wall of gas molecules covering and flowing along the inner surfaces 85, 94, 96, 108 of the annular nozzle assembly 20 and, more importantly, so as to flow between the TEOS gas molecules 40 and the water vapor molecules 42 from the reaction furnace 21 and the inner surfaces 85, 94, 96, 108 of the annular nozzle assembly 20. Therefore, the gas molecules flowing through the slots 84, 98 form a boundary or wall between the TEOS gas molecules 40 and water vapor molecules 42 flowing into the annular nozzle assembly 20 from the reaction chamber 21 and the inner surfaces 85, 94, 96, 108 of the annular nozzle assembly 20. The generally cylindrically or tubular shaped wall or boundary layer of gas flows downstream away from the reaction furnace 21 along the inner surfaces 85, 94, 96, 108 of the annular nozzle assembly 20 such that the gas must be continuously pumped or fed from the source 126 into the pipe segment 58 through the gas inlet 122 during the manufacturing process.

The gas molecules forming the thin virtual wall or boundary layer on the surfaces 85, 94, 96, 108 of the annular nozzle assembly 20 will not react with the TEOS gas molecules 40 or the water vapor molecules 42 flowing through the hollow interior volume of the annular nozzle assembly 20. Rather, when a TEOS gas molecule 40 or water vapor molecule 42 collides with or otherwise strikes a gas molecule from the boundary layer, the gas molecule will be directed or deflected toward the inner surfaces 85, 94, 96, 108 of the annular nozzle assembly 20 while the TEOS gas molecule 40 or water vapor molecule 42 will be directed or deflected away the inner surfaces 85, 94, 96, 108 of the annular nozzle assembly 20. The gas pressure within the annular nozzle assembly 20 is preferably kept high enough to ensure that there are enough collisions between the gas molecules forming the boundary layer and the TEOS gas molecules 40 and the water vapor molecules 42 to continuously direct the gas molecules forming the boundary layer toward the inner surfaces 85, 94, 96, 108 of the annular nozzle assembly 20 and to continuously direct the TEOS gas molecules 40 and the water vapor molecules 42 away from the inner surfaces 85, 94, 96, 108 of the annular nozzle assembly 20. By way of analogy for purposes of further explanation, a person in an empty subway car can more easily move from one side of the subway car to the other side of the subway car without bumping into or contacting any one else than a person in a crowded subway car. The collisions between people in the crowded subway car keep people from moving too far in the crowded subway car and keep the relative positions of the people from changing too fast. In much the same way, a large amount of TEOS gas molecules 40 and water vapor molecules 42 will keep the barrier gas molecules forming the boundary layer or wall from drifting or diffusing away from the surfaces 85, 94, 96, 108 of the annular nozzle assembly 20 so as to maintain the integrity of the moving layer or virtual wall of gas covering and flowing along the inner surfaces 85, 94, 96, 108 of the annular nozzle assembly 20 which will, as a result, keep the TEOS gas molecules 40 and the water vapor molecules 42 away from contacting the inner surfaces 85, 94, 96, 108 of the annular nozzle assembly 20.

A laminar flow of the gas molecules along the inner surfaces 85, 94, 96, 108 of the annular nozzle assembly 20 is preferred so as to minimize the radially inward movement of the barrier gas molecules in the pipe line segments 52, 58 which will reduce the efficiency, integrity, and coherency of the cylindrically shaped moving wall or boundary layer of gas molecules. Turbulent flow of the barrier gas molecules along the inner surfaces 85, 94, 96, 108 of the annular nozzle assembly 20 will cause the gas molecules to tend to migrate or flow away from the inner surfaces 85, 94, 96, 108 of the annular nozzle assembly 20. Furthermore, abrupt changes in flow direction created by pipe segments downstream of the pipe segments 52, 58 are preferably avoided since they will tend to cause the flowing layer of barrier gas molecules to separate or distance themselves from the inner surfaces of the pipe segments. The inner surfaces 72, 85, 94, 96, 108 of the annular nozzle assembly 20 are preferably smooth so as to reduce turbulence in the gas boundary layer or moving virtual wall.

The pressure in the reaction furnace 21 can also impact the performance of the annular nozzle assembly 20. More specifically, if the pressure in the reaction furnace 21 is too low, molecular flow will be created in the pipe line segments 52, 58, thereby reducing the effectiveness of the boundary layer of flowing gas by creating molecular flow of the TEOS gas molecules 40 and the water vapor molecules 42 in the hollow interior volume of the annular nozzle assembly 20 and reducing the pressure in the hollow interior volume of the annular nozzle assembly 20. That is, if too few TEOS gas molecules 40 and water vapor molecules 42 are present in the hollow interior volume of the annular nozzle assembly 20, there will not be enough collisions between the TEOS gas molecules 40 and the water vapor molecules 42, and the gas molecules flowing into the hollow interior volume of the annular nozzle assembly 20 to keep the gas molecules positioned and flowing along the inner surfaces 85, 94, 96, 108 of the annular nozzle assembly 20, as previously discussed above. Furthermore, there will not be enough collisions between the TEOS gas molecules 40 and the water vapor molecules 42, and the gas molecules to keep the TEOS gas molecules 40 and the water vapor molecules 42 positioned away from the inner surfaces 72, 85, 94, 96, 108 of the annular nozzle assembly 20 and to keep the TEOS gas molecules 40 and the water vapor molecules 42 from contacting and residing on the inner surfaces 85, 94, 96, 108 of the annular nozzle assembly 20. In addition, there will not enough collisions between two TEOS gas molecules 40, two water vapor molecules 42, or between a TEOS gas molecule 40 and a water vapor molecule 42 to keep the mean free path of the collisions smaller than the inner diameter of the annular nozzle assembly 20.

The mean free path for gas molecules is the average distance a molecule will travel before colliding with another molecule. The mean free path for a molecule can be calculated from the following equation:

$$\lambda = \frac{2.33 \times 10^{-20} T}{p d^2} \quad (4)$$

where T is the temperature in degrees kelvin (°K), p is the pressure in torr, d is the diameter of the molecules in centimeters, and λ is the mean free path of the molecules in centimeters. For example, the mean free path for nitrogen molecules ($N_2$) in the pump line segment 52 when the pressure within the pump line segment 52 is one torr and the temperature within the pump line segment 52 is 120° C. is 0.06 millimeters.

When the mean free path of the TEOS gas molecules 40 and the water vapor molecules 42 is greater than the diameter of the annular nozzle assembly 20, the TEOS gas molecules 40 and the water vapor molecules 42 will more easily be able to flow across the inner volume of the annular nozzle assembly 20 and contact and reside on the inner surfaces 72, 85, 94, 96, 108 of the annular nozzle assembly 20. Therefore, the pressure within the annular nozzle assembly 20 created by the TEOS gas molecules 40 and the water vapor molecules 42 is preferably maintained above ten millitorr so as to keep the density of the molecules in the annular nozzle assembly 20 and the number of collisions between the molecules in the annular nozzle assembly 20 sufficiently high to maintain the integrity of the thin moving wall or flowing boundary layer of gas molecules between the inner surfaces 85, 94, 96, 108 of the annular nozzle assembly 20 and the TEOS gas molecules 40 and the water vapor molecules 42 flowing through the interior volume of the annular nozzle assembly 20. Fortunately, most TEOS silicon dioxide CVD processes are operating above the preferred ten millitorr pressure. The flow rate of the gas into the inlet 122 on the pipe segment 58 should be high enough to create a boundary layer or virtual wall of gas molecules along the inner surfaces 85, 94, 96, 108 of the annular nozzle assembly 20 and can be increased or decreased as necessary or desired depending on the diameters of the pipe segments 52, 58 and the annular nozzle assembly 20, and the length of the annular nozzle assembly 20. For example, in a three inch diameter pipe segment 52 with an annular nozzle assembly 20 having an inner diameter of two and one-half inches and a length of approximately eight inches, the flow rate of the gas into the pipe segment 58 through the gas inlet 122 should be approximately one hundred to two hundred standard cubic centimeters per minute (sccm) to create a suitable boundary layer of gas molecules. The mass flow rate of the gas being injected or flowing into the pipe segment 58 through the gas inlet 122 can be controlled by a mass flow controller 128 which can be, for example, a MKS Model 1259C-00500RV Mass Flow Controller marketed by MKS Instruments, Inc., of Andover, Mass.

Figure 14:
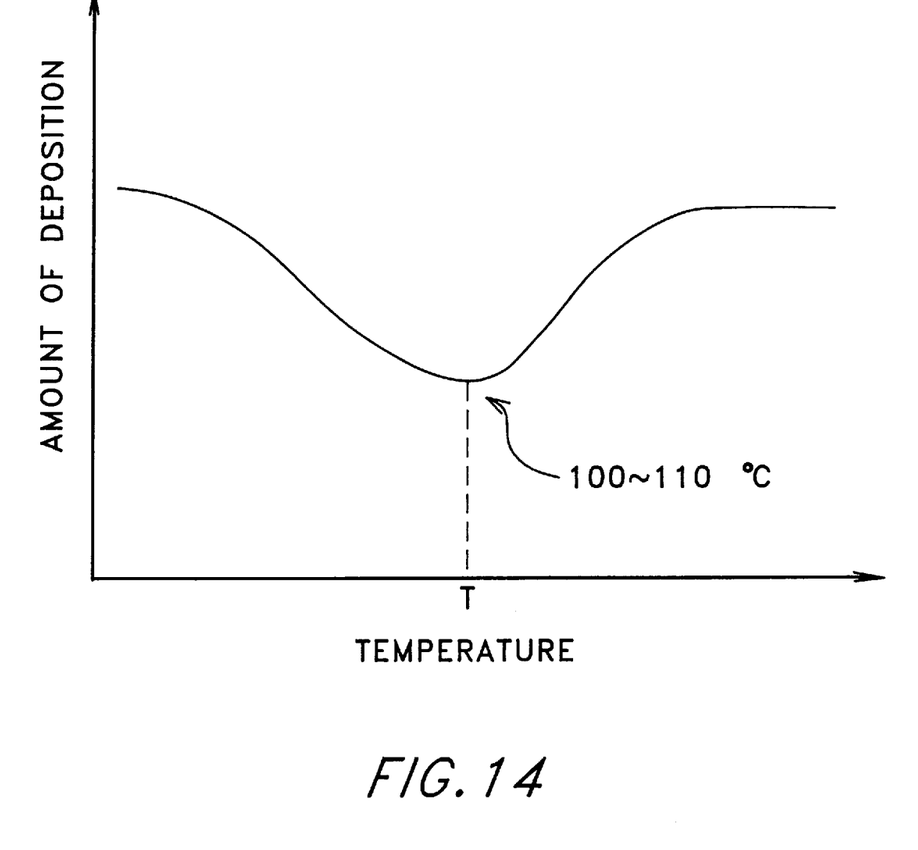
FIG. 14 is a graph showing the thickness of the solidified chains of polymerized TEOS molecules deposited on the surface of the exit pipe line segment of FIG. 1 as a function of temperature of the surface.

As previously discussed above, the chemical structure of the chains of polymerized TEOS molecules is also a function of temperature within the pipe segments 52, 58 and the temperature of the chains of polymerized TEOS molecules. More specifically, denser and harder polymerized TEOS material will be formed at high temperatures which, when deposited on the inner surfaces of the pipes or pump lines, will require significant force to remove, thereby making the cleaning of the pipes or pump lines by removal of the solid chains of polymerized TEOS molecules difficult, expensive, and time consuming. At low temperatures, the chains of polymerized TEOS molecules form a crystal-like transparent material that has a lower density in comparison to the solid material created at high temperatures and is significantly easier to break, thereby presumably making the pipe or pump line segments easier to clean. Therefore, an incentive exists to reduce the temperature of the inner surfaces of the pipe or pump line segments through which TEOS gas molecules and water vapor molecules are flowing to reduce the rate of chemical reaction between the TEOS gas molecules and the water vapor molecules in the pipe or pump line segments. Unfortunately, lowering the temperature of the inner surfaces of the pipe or pump segments will increase the rate of adsorption or surface retention of the water vapor molecules and TEOS gas molecules on the inner surfaces of the pipe or pump line segments, thereby increasing the resident time of the water vapor molecules and the TEOS gas molecules on the inner surfaces, which will also increase the amount of TEOS and $H_2O$ molecules chemical reaction. Thus, the amount of deposited material on the inner surfaces of the pipe segments will increase. Therefore, there is an optimal temperature T, as illustrated in FIG. 14, at which the inner surfaces of pipe or pump line segments are preferably maintained so as to minimize the amount of deposition of solidified chains of polymerized TEOS molecules. Below such optimal temperature T, deposition of solidified chains of polymerized TEOS molecules is undesirably increased as a result of increased adsorption of the water vapor molecules and the TEOS gas molecules on the inner surfaces of the pipe or pump line segments which increases the amount of TEOS gas molecules and water vapor molecules available for surface chemical reaction. Above which temperature T the rate of chemical reaction between the TEOS gas molecules and the water vapor molecules is undesirably increased, both situations in which the amount of solidified chains of polymerized TEOS molecules deposited on the inner surfaces of the pipe or pump line segments is increased. The temperature T is preferably in a range between ninety-five degrees celsius (95° C.) and one-hundred and twenty-five degrees celsius (125° C.) and is optimally one-hundred and ten degrees celsius (110° C.) for a pipe of pump line segment, such as the pipe or pump line segments 52, 58, having an inner diameter of three inches. As previously discussed above, the inner surfaces of pipe segments can be heated by placing a heater or heating jacket (not shown) around the outside of the pipe segment.

While the annular nozzle assembly 20 will prevent most, if not all, of the deposition and build-up of chains of polymerized TEOS molecules on the inner surfaces of the annular nozzle assembly 20, a heater or heating jacket is preferably wrapped around the pipe segments 52, 58 to heat the inner surfaces 54, 56 of the respective pipe segments 52, 58. Heat from the heater or heating packet will be transmitted by either conduction or radiation to heat the annular nozzle assembly 20 and, preferably, the inner surfaces of the annular nozzle assembly 20. The inner surfaces of the annular nozzle assembly 20 are preferably heated to a temperature in a range between 90° C. to 120° C. Furthermore, the gas (or fluid) injected through the inlet 122 into the pipe segment 58 and flowing through the slots 84, 98 of the annular nozzle assembly 20 is preferably heated prior to injection to a temperature between 90° C. and 140° C. to aid in minimizing deposition and build-up of solid material in the manner previously discussed above. The heated gas (or fluid) works in a manner similar to the heating of the pipe segments 52, 58 discussed above in order to reduce the amount of deposition and build up of solid chains of polymerized TEOS on the inner surfaces 72, 85, 94, 96, 108 of the annular nozzle assembly 20. The heated gas also desorbs some of the water vapor molecules 42 adsorbed onto the inner surfaces 72, 85, 94, 96, 108 of the annular nozzle assembly 20, thereby reducing the resident time for the gas molecules adsorbed on the inner surfaces 72, 85, 94, 96, 108 of the annular nozzle assembly 20 and, as a result, reducing the amount of surface chemical reaction between the TEOS gas molecules 40 and the water vapor molecules 42 on the inner surfaces 72, 85, 94, 96, 108 of the annular nozzle assembly 20.

Since the upstream collar 22 does not contain any slots or openings similar to the slots 84, 98 in the middle section 26 and downstream spacer ring 24, respectively, and, more specifically, since the boundary layer or virtual wall of gas formed on the inner surfaces 85, 94, 96, 108 of the annular nozzle assembly 20 will not usually cover the inner surface 72 of the upstream collar 22, the longitudinal or axial length of the inner surface 72 of the upstream collar 22 is preferably minimized so as to reduce or prevent surface chemical reaction of the TEOS gas molecules 40 and the water vapor molecules 42 on the inner surface 72 of the upstream collar 22. In contrast, the longitudinal or axial lengths of the middle section 26 and the downstream spacer ring 24 are chosen more for ease of manufacturing and installation and are preferably between one inch and three inches long, although other lengths are certainly possible.

After the semiconductor manufacturing process using the apparatus of this invention is completed, the annular nozzle assembly 20 can be removed from the pipe segments 52, 58 and replaced or cleaned if necessary. A significantly less of amount of solid chains of polymerized TEOS molecules will be deposited on the inner surfaces 72, 85, 94, 96, 108 than would be deposited on the inner surfaces 54, 56 of the pipe segments 52, 58, respectively, using conventional techniques. In addition, the location of the vast majority, if not all, of the deposition of the solid chains of polymerized TEOS molecules will be located further downstream from the reaction furnace 21 than is currently possible using conventional techniques, thereby preventing particulate material comprising solid chains of polymerized TEOS molecules from flowing back through the furnace outlet 50 into the reaction furnace 21 and contaminating the wafers being processed in the reaction furnace 21.

The foregoing description is considered as illustrative only of the principles of the invention. Furthermore, since numerous modifications and changes will readily occur to those skilled in the art, it is not desired to limit the invention to the exact construction and process shown and described above. Accordingly, all suitable modifications and equivalents may be resorted to falling within the scope of the invention as defined by the claims which follow.

The embodiments of the invention in which an exclusive property or privilege is claimed are defined as follows:

1. Apparatus for conducting a flowing fluid, comprising:
   an elongated conduit having a wall with an inside surface that surrounds a space, said elongated conduit having an inlet opening through which a first fluid flows into the space and an outlet opening through which the first fluid flows out of the space;
   a nozzle positioned adjacent the inside surface between the inlet opening and the outlet opening and directed longitudinally toward said outlet opening; and
   a source of a second fluid outside said conduit connected to said nozzle.

2. The apparatus of claim 1, including a port in said wall between the inlet opening and the outlet opening and connected in fluid flow relation to said nozzle.

3. The apparatus of claim 2, wherein said source of second fluid is connected in fluid flow relation to said port.

4. The apparatus of claim 2, wherein said nozzle comprises a deflector positioned a distance spaced radially inward from said port.

5. The apparatus of claim 4, including a first plurality of ports extending through said wall and dispersed angularly from each other around said space, and wherein said deflector includes a first inner sleeve positioned in said space in radial alignment with said first plurality of ports to form an annular nozzle around the space adjacent the wall.

6. The apparatus of claim 5, wherein said source of a second fluid includes an outer shell positioned around and radially spaced outward from the wall to form a plenum between the wall and the shell in fluid flow alignment with said first plurality of ports, said source of a second fluid being connected in fluid flow relation to said plenum.

7. The apparatus of claim 6, wherein said first fluid has a first pressure in said space, and wherein said second fluid has a second pressure in said plenum that is greater than said first pressure.

8. The apparatus of claim 5, including a second plurality of ports extending through said wall and dispersed angularly from each other around said space.

9. The apparatus of claim 1, wherein said inside surface has a temperature in a range between 90° C. and 120° C.

10. The apparatus of claim 1, wherein said second fluid comprises an inert gas.

11. The apparatus of claim 10, wherein said inert gas comprises nitrogen.

12. The apparatus of claim 1, wherein said second fluid comprises a reactive gas.

13. The apparatus of claim 1, wherein said second fluid has a temperature in a range between 90° C. and 120° C.

14. Apparatus for conducting a flowing fluid, comprising:
   an elongated conduit having a wall with an inside surface that surrounds a space, said elongated conduit having an inlet opening into said space, an outlet opening from said space, and a plurality of ports extending through said wall, said ports being dispersed in angular spaced relation to each other around said wall between said inlet opening and said outlet opening; and
   an nozzle extending around the inside surface of the wall in fluid flow relation to said plurality of ports and directed longitudinally toward said outlet opening.

15. The apparatus of claim 14, wherein said elongated conduit and said wall are tubular, said nozzle in annular, and including an outer shell positioned around and radially spaced outward from the tubular wall of the elongated conduit to enclose a plenum around said tubular wall and in fluid flow relation with said annular nozzle through said plurality of ports.

16. The apparatus of claim 15, wherein said annular nozzle comprises a tubular sleeve positioned in the space in radially inward spaced concentric relation to the tubular wall to form an annulus between the sleeve and the tubular wall, said annulus being in fluid flow communication with said plurality of ports.

17. The apparatus of claim 16, wherein said annular nozzle includes a ring connectable to said tubular wall around said inlet opening and said tubular sleeve extends from said ring longitudinally into said space.

18. The apparatus of claim 17, wherein said tubular wall is internally threaded adjacent said inlet opening and said tubular sleeve is externally threaded adjacent said ring and sized to screw into the internally threaded end of the tubular wall.

19. The apparatus of claim 18, wherein said shell includes an elongated tubular pipe and said elongated conduit is positioned inside said elongated tubular pipe section.

20. The apparatus of claim 19, wherein said elongated tubular pipe has an inside surface and said ring includes an annular flange that extends radially outward to the inside surface of the elongated tubular pipe section.

21. The apparatus of claim 20, including a seal around the peripheral surface of the ring between the flange and the inside surface of the tubular pipe.

22. The apparatus of claim 20, wherein s aid elongated conduit includes an annular collar that extends radially outward from the tubular wall at a location on the tubular wall that is between the ports and the outlet opening.

23. The apparatus of claim 22, wherein said annular collar ex tends radially from the tubular wall of the elongated conduit to the inside surface of the tubular pipe.

24. The apparatus of claim 23, wherein the tubular pipe, tubular wall, flange, and collar enclose an annular plenum surrounding the tubular wall such that said ports open into the annular plenum and provide fluid flow communication between the annular plenum and the annulus of the annular nozzle.

25. The apparatus of claim 24, including a source of barrier fluid connected in fluid flow relation to said plenum.

26. The apparatus of claim 25, wherein said space is at a first pressure, and wherein said source of barrier fluid is at a second pressure that is higher than said first pressure.

27. The apparatus of claim 15, including a heater positioned around said outer shell and capable of directing heat toward said outer shell.

28. The apparatus of claim 27, wherein said outer shell has an outer surface and said heater heats said outer surface of said outer shell to a temperature in a range between 120° C. and 140° C.

29. The apparatus of claim 14, wherein said fluid comprises an inert gas.

30. The apparatus of claim 29, wherein said inert gas comprises nitrogen.

31. The apparatus of claim 14, wherein said fluid comprises a reactive gas.

32. The apparatus of claim 14, wherein said fluid has a temperature between 90° C. and 120° C.

33. The apparatus of claim 14, wherein said inside surface has a temperature in a range between 90° C. and 120° C.

34. Apparatus for conducting a flowing fluid, comprising:
an elongated conduit having a tubular wall with an inside surface that surrounds a space, said elongated conduit having an inlet opening into said space, an outlet opening from said space, and multiple sets of ports extending through said tubular wall, each of said multiple sets of ports having a plurality of ports in angular spaced relation to each other around said tubular wall between said inlet opening and said outlet opening, and each of said sets of ports being spaced longitudinally from each other along the tubular wall of said elongated conduit; and
a plurality of annular nozzles, each of which extends around the inside surface of the tubular wall in fluid flow relation with the plurality of ports in a respective one of said sets of ports such that each of said sets of ports is in fluid flow communication with one of said annular nozzles and is directed longitudinally toward said outlet opening.

35. The apparatus of claim 34, including a source of barrier fluid connected in fluid flow relation to each of said sets of ports and having sufficient pressure to force barrier fluid through said annular nozzles into said space in sufficient volume to maintain said barrier fluid flowing in laminar flow on the inside surface of said tubular wall between said plurality of annular nozzles such that said laminar flow of barrier fluid coats substantially all of said inside surface of said tubular wall between said plurality of annular nozzles with a layer of said barrier fluid.

36. The apparatus of claim 35, wherein said barrier fluid comprises a gas.

37. The apparatus of cl aim 36, wherein said flowing fluid comprises TEOS gas.

38. The apparatus of claim 36, wherein said gas comprises an inert gas.

39. The apparatus of claim 38, wherein said inert gas comprises nitrogen.

40. The apparatus of claim 36, wherein said barrier fluid has a temperature in a range between 120° C. and 140° C.

41. The apparatus of claim 35, wherein said source of barrier fluid includes an outer shell positioned around and radially spaced outward from said tubular wall to form a plenum between the tubular wall and the outer shell in fluid flow alignment with said first plurality of ports, said source of a coating fluid being connected in fluid flow relation to said plenum.

42. The apparatus of claim 41, including a heater positioned around said outer shell and capable of directing heat toward said outer shell.

43. The apparatus of claim 42, wherein said outer shell has an outer surface and said heater heats said outer surface of said outer shell to a temperature in a range between 120° C. and 140° C.

44. The apparatus of claim 34, wherein said inside surface of said elongated conduit has a temperature in a range between 90° C. and 120° C.

45. The apparatus of claim 34, wherein said tubular wall comprises a plurality of separate tubing wall sections that are connectable together, each of said tubing wall sections being tubular in shape with a first end and a second end and including one of said sets of ports between said first end and said second end.

46. The apparatus of claim 45, wherein each of said annular nozzles includes a tubular sleeve positioned in radially inward spaced concentric relation to one of said tubing wall sections to form an annulus between the sleeve and the tubular wall, said annulus being in fluid flow communication with the set of ports in the tubing wall section.

47. The apparatus of claim 46, wherein the annular sleeve of at least one of said annular nozzles extends longitudinally from the second end of a first one of the tubing wall sections into the first end of a second one of the tubing wall sections.

48. The apparatus of claim 47, wherein the inside surface of said first one of the tubular wall sections is tapered from a larger diameter adjacent the annulus of the annular nozzle to a smaller diameter adjacent the second end of said first one of said tubular wall sections.

49. A method for inhibiting adsorption of effluent from a reaction chamber flowing into an elongated hollow conduit onto inner surfaces of the conduit, comprising the steps of:
injecting a fluid into the conduit; and
directing said fluid to flow between the inner surface of the conduit and the effluent.

50. The method of claim 49, including the step of directing said fluid to flow in a direction generally downstream of the reaction chamber.

51. The method of claim 50, wherein said step of directing said fluid to flow between the inner surface of the conduit includes directing said fluid to flow laminarly along the surface of inner the conduit.

52. The method of claim 49, wherein said effluent includes TEOS gas.

53. The method of claim 52, wherein said effluent includes water vapor.

54. The method of claim 49, wherein said fluid comprises a gas.

55. The method of claim 54, wherein said gas comprises nitrogen.

56. The method of claim 49, including the step of heating said fluid before said step of injecting the fluid into the conduit.

57. The method of claim 56, wherein said fluid is heated to a temperature in a range between 90° C. and 120° C.

58. The method of claim 49, including the step of heating the inner surface of the conduit.

59. The method of claim 58, wherein the inner surface of the conduit is heated to a temperature in a range between 90° C. and 120° C.

60. The method of claim 49, including the step of positioning said conduit within a sleeve such that a plenum is formed between the conduit and the sleeve.

61. The method of claim 60, including the step of connecting a source of said fluid in fluid flow relation with said plenum.

62. The method of claim 61, wherein said step of injecting said fluid into said conduit includes allowing said fluid to flow from said plenum to said inner surfaces of the conduit.

63. A method for inhibiting contact between molecules flowing through an elongated conduit having an inner surface, an outer surface, an inlet, and an outlet, and the inner surface of the conduit, comprising the steps of:

allowing a barrier fluid to flow into the conduit; and directing said barrier fluid through the conduit such that said barrier fluid flows toward the outlet and between the molecules and the inner surface of the conduit.

64. The method of claim 63, including the step of directing said barrier fluid so that said barrier fluid flows in proximity to the inner surface of the conduit.

65. The method of claim 64, wherein said barrier fluid flows laminarly along the inner surface of the conduit.

66. The method of claim 63, wherein said molecules include TEOS gas molecules.

67. The method of claim 66, wherein said molecules include water vapor molecules.

68. The method of claim 63, wherein said barrier fluid comprises a gas.

69. The method of claim 68, wherein said gas comprises nitrogen.

70. The method of claim 63, including the step of heating said barrier fluid before said step of allowing the barrier fluid to flow into the conduit.

71. The method of claim 70, wherein said barrier fluid is heated to a temperature in a range between 90° C. and 120° C.

72. The method of claim 63, including the step of heating the inner surface of the conduit.

73. The method of claim 72, wherein the inner surface of the conduit is heated to a temperature in a range between 90° C. and 120° C.

74. The method of claim 63, including the step of forming an enclosed plenum around the outer surface of the conduit.

75. The method of claim 74, including the step of connecting a source of said barrier fluid in fluid flow relation with said plenum.

76. The method of claim 75, wherein said step of allowing said barrier fluid to flow into said conduit includes allowing said barrier fluid to flow from said plenum to said inner surface of the conduit.

* * * * *